United States Patent [19]
Moulton

[11] Patent Number: 5,572,100
[45] Date of Patent: Nov. 5, 1996

[54] SEMICONDUCTIVE POWER UNIT FOR VARIABLE SPEED DRIVE MOTOR

[75] Inventor: Craig W. Moulton, Golden, Colo.

[73] Assignee: Cobe Laboratories, Inc., Arvada, Colo.

[21] Appl. No.: 330,521

[22] Filed: Oct. 28, 1994

[51] Int. Cl.⁶ .................................. H02P 5/16; H02P 5/06
[52] U.S. Cl. .......................... 318/434; 318/139; 318/257; 318/493
[58] Field of Search ................................ 318/138, 139, 318/245, 254, 430–464

[56] References Cited

U.S. PATENT DOCUMENTS

| | | |
|---|---|---|
| 3,777,244 | 12/1973 | Kosaka . |
| 4,195,254 | 3/1980 | Gurwicz et al. . |
| 4,667,121 | 5/1987 | Fay et al. . |
| 4,675,588 | 6/1987 | Talbot . |
| 4,814,687 | 3/1989 | Walker . |
| 4,829,218 | 5/1989 | Bauer . |
| 4,829,230 | 5/1989 | Perry . |
| 5,162,710 | 11/1992 | Reinhart et al. . |

Primary Examiner—Paul Ip

[57] ABSTRACT

A semiconductive power unit for controlling drive motor speed by controlling the power applied to the motor through a variable or switchable semiconductive control element, such as a Darlington transistor. Electrical power is supplied from a power supply to the variable speed drive motor via the controllable semiconductive device connected to provide a variable impedance branch path between the power supply and the variable speed drive motor. A power dissipation characteristic for the variable impedance branch path is established, wherein current flow therethrough decreases monotonically with increasing voltage across the variable impedance branch path. The circuit establishing the characteristic also provides a feedback signal to the controllable semiconductive device to maintain its operation at the established power dissipation characteristic. The method involves determining a maximum permissible power dissipation for the impedance of the controllable semiconductive device, establishing a power dissipation limit characteristic including the step of calculating the constants A, B, and C for the relationship $$AV+BI-C=0$$

where the relationship represents a line segment starting from the value of V for which I is zero and proceeding to, and past, a tangent point with a curve of a constant product of V and I, where the constant product is the maximum permissible power dissipation.

20 Claims, 7 Drawing Sheets

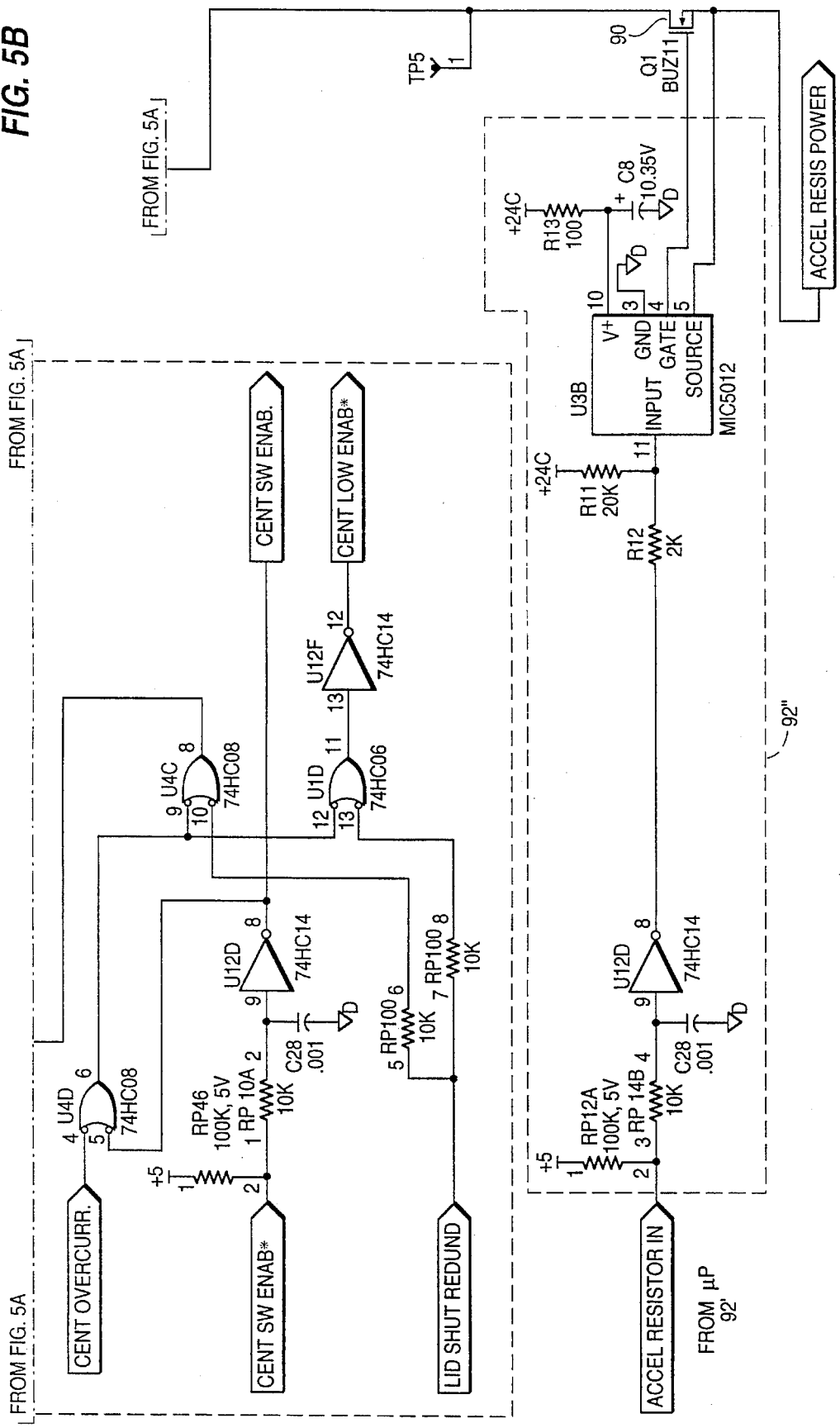

SEMICONDUCTIVE POWER UNIT FOR VARIABLE SPEED DRIVE MOTOR

BACKGROUND OF THE INVENTION

1. Field of the Invention

The present invention relates to an apparatus, and a related method, for protecting a transistor subject to varying current and voltage, and more specifically to an apparatus and method for protecting a transistor that supplies current and voltage to a variable speed drive motor, such as a drive motor that drives a variable speed centrifuge.

2. Description of the Related Art

Transistor control units, such as those controlling variable speed drive motors, are occasionally subject to overheating, such as during start-up of the motor or other controlled unit. The typical ways of protecting such a transistor control unit generally fall into three main categories. In the first, the temperature of the transistor is directly measured, and control is based upon that measurement. Not only is an additional device required, but also the wiring harness for the controlled device becomes more complex on account of additional wires to the transistor control unit. Moreover, the thermal lag of the temperature sensor and the protected transistor itself jeopardizes the effectiveness of the protection.

The second way to protect the transistor control unit relies on the predictive capabilities of software algorithms; but this approach fails if the software fails on account of a state that was not anticipated. For example, the software may try to start the drive motor when it has stalled under conditions that positively prevent restart. This action may wreck the drive motor or driven centrifuge.

Lastly, the transistor control unit can be integrated into a power regulator of known type with any of several internal monitoring and shutdown features. Unfortunately, the output transistor of such a regulator has a lower saturation voltage than is desired in a transistor control unit for the applications envisioned above.

Moreover, in the particular field of application involving a drive motor and a driven centrifuge, a fairly simple technique involves pulse-width-modulation control of the drive motor by the transistor control unit based on any of several possible feedback control parameters. The implementation of this approach creates electrical and mechanical noise and electromagnetic interference that require expensive, bulky, and otherwise undesirable shielding in many environments. For example, in a surgical environment such as that required for autologous blood salvage by centrifuge, medical personnel and patients object to these characteristics. Nevertheless, the known alternative approach limits starting motor current to a single value that is safe throughout the motor and centrifuge start-up period. Very slow start-up results.

It would be desirable to avoid one or more of these problems.

SUMMARY OF THE INVENTION

Applicant has recognized that superior protection can be provided for a transistor control unit while avoiding the above-described problems. The invention employs an apparatus and a method disclosed hereinafter. The apparatus includes a transistor control unit and associated circuit that controls the drive motor current according to a characteristic that provides a relatively high initial starting current but limits the power dissipation in the output circuit of the transistor control unit to be less than a reference value of power dissipation and, further, to be less than the reference value by a margin under all but one particular set of conditions.

According to the invention, a semiconductive power unit for a variable speed drive motor supplies electrical power to the variable speed drive motor and includes a controllable semiconductive device connected to provide a variable impedance branch path between a power supply and the variable speed drive motor. A power dissipation characteristic is established for the variable impedance branch path, wherein current flow therethrough decreases monotonically with increasing voltage and provides maximum power dissipation in the variable impedance branch path for respective intermediate values of current and voltage, said maximum power dissipation being a safe value for the controllable semiconductive device, the establishing means including means for providing a feedback signal to the controllable semiconductive device to maintain its operation at the power dissipation characteristic.

In the preferred embodiment, the transistor control unit and associated circuit, in reliance upon the characteristic, allows the output circuit power dissipation to approach the reference value at only one, intermediate, value of starting motor current, a so-called tangent value, while providing a margin at all other times.

The preferred method of the invention includes the steps of controlling the drive current to a drive motor according to a characteristic, in which the current is a decreasing function of the voltage across the output circuit of a transistor control unit for the drive motor, and shutting off the output circuit of the transistor control unit whenever the current through the output circuit and the voltage across it define a point lying above the characteristic, or, ill other words, the pair of values has one excessive value when the other value is found on the characteristic.

The method, according to the invention, for controlling power supplied to a variable speed drive motor by varying the impedance of a controllable semiconductive device and concurrently limiting power dissipation in the controllable semiconductive device, comprises the steps of supplying power to the variable speed drive motor at least partly through the impedance of the controllable semiconductive device, and establishing a power dissipation limit characteristic for the impedance of the controllable semiconductive device, wherein current flow therethrough decreases with increasing voltage across the impedance and provides maximum power dissipation in the impedance of the controllable semiconductive device for respective intermediate values of current and the voltage. The method includes maintaining operation of the controllable semiconductive device at the power dissipation limit characteristic by supplying a feedback signal to the controllable semiconductive device.

Additional features and advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate preferred embodiments of the apparatus and method according to the invention and, together with the description, serve to explain the principles of the invention.

BRIEF DESCRIPTION OF THE DRAWINGS

FIGS. 5A and 5B shows still other circuit details compatible with the implementation of FIG. 1.

DESCRIPTION OF THE PREFERRED EMBODIMENT

Reference will now be made in detail to a preferred embodiment of the invention, an example of which is illustrated in the accompanying drawings. Wherever possible, the same reference numbers will be used throughout the drawings to refer to the same or like parts.

In the apparatus of the present invention, there is provided means for supplying electrical power from a power supply to the variable speed drive motor, including a controllable semiconductive device connected to provide a variable impedance branch path between the power supply and the variable speed drive motor, and means for establishing a power dissipation characteristic for the variable impedance branch, wherein current flow therethrough decreases monotonically with increasing voltage across it and provides maximum power dissipation in the variable impedance branch path for respective intermediate values of current and voltage. The maximum power dissipation is a safe value for the controllable semiconductive device. The establishing means includes means for providing a negative feedback signal to the controllable semiconductive device to maintain its operation at the power dissipation characteristic.

Figure 1:
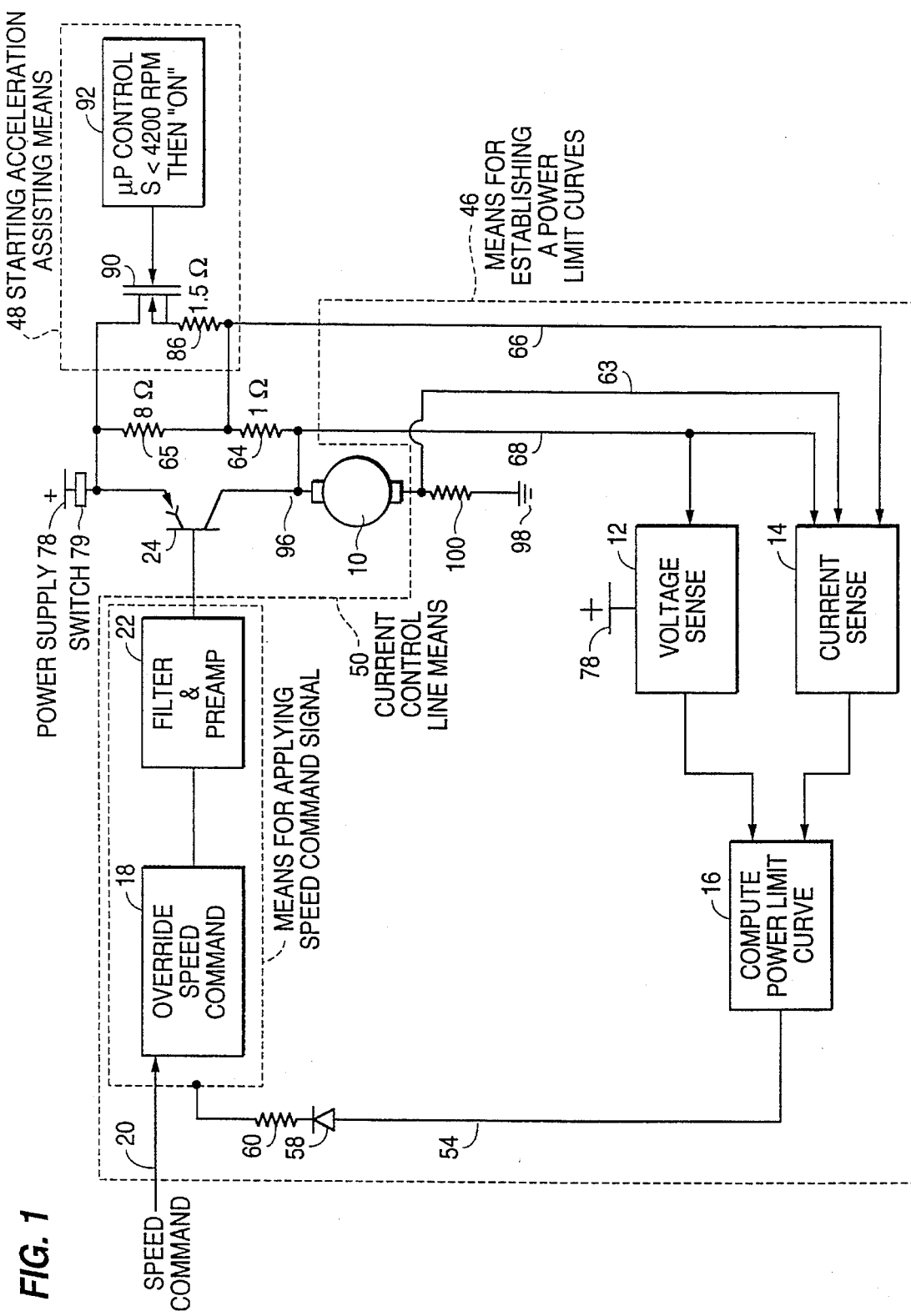
FIG. 1 is a partially schematic and partially block diagrammatic showing of a circuit according to a preferred embodiment of the invention.

In the implementation of FIG. 1, a centrifugal autologous blood salvage (ABS) apparatus incorporates a variable speed centrifuge drive motor and a semiconductive power unit according to the invention.

Figure 2:
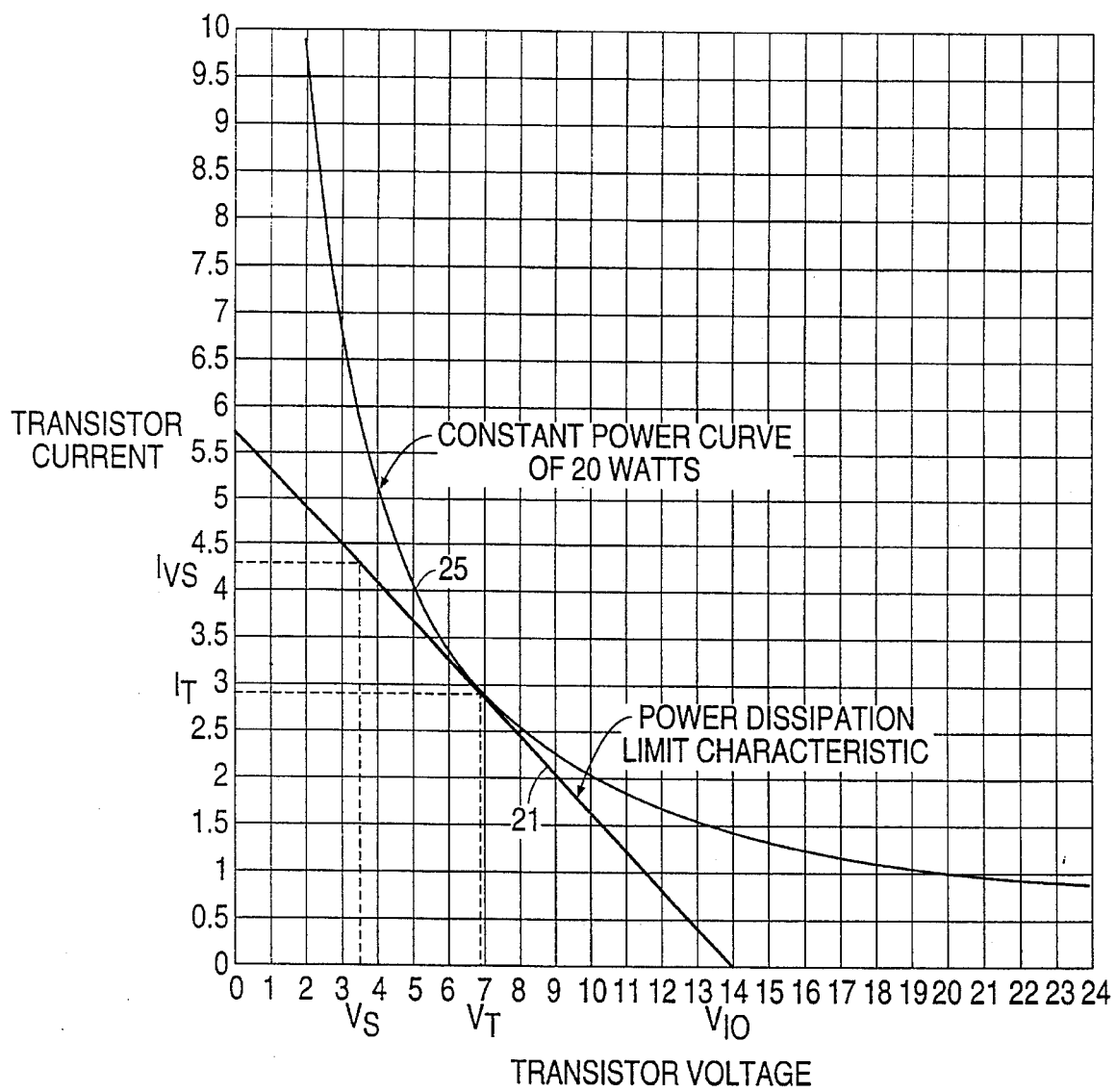
FIG. 2 shows curves illustrating principles of the invention.

Referring to FIG. 1, the ABS apparatus (not shown) is driven by a motor 10. Starting acceleration of the apparatus and motor is assisted by starting acceleration assisting means 48. The start-up and operation of motor 10 is controlled by controlling the power applied to the motor through a transistor 50, a Darlington transistor in the preferred embodiment. Transistor 50 dissipates significant power in its emitter-to-collector impedance, particularly during motor start-up when the motor experiences what is known as starting in-rush current. This power dissipation is limited, according to the invention, by a means 46 for establishing a power dissipation limit characteristic to prolong the life of the transistor 50 and to avoid related maintenance problems. The voltage across the transistor 50 junction is sensed by a voltage sensing circuit 12 and the current through the junction is sensed by a current sensing circuit 14. A characteristic, a set of related values, is computed by a power dissipation limit circuit 16 as a function of sensed voltage and current. In the preferred embodiment, the characteristic is a straight line, e.g.

$$AV+BI-C=0, \qquad (1)$$

where A, B, and C are constants, V is the voltage across the emitter-to-collector impedance of transistor 50 and I is the current flowing through that impedance, as shown in FIG. 2. Operation is maintained at that characteristic within a deviation limit, $D_L$, greater than zero, so that $$D_L=AV+BI-C. \qquad (2)$$

When plotted on a voltage versus current plot this straight-line function 21 falls below a hyperbolic plot of the function 25 of a constant product VI=POWER$_{MAX}$, the constant power curve in FIG. 2, which is a safe value of the power dissipation in the transistor, for example, 20 watts. While the limiting characteristic is shown as a straight line, it could also be curved, so long as it falls below the safe value. It could even conform to a hyperbolic, constant-power curve. By limiting the values of voltage and current so that they fall on or below this characteristic 21, power dissipation in the transistor junction is held below 20 watts, for example. By deviating from the hyperbolic curve, the limiting characteristic provides an extra margin of safety at all points except a possible point of tangency, $V_T$, $I_T$. Notice that characteristic 21 extends beyond the point of tangency to a point representing a saturated condition of transistor 50.

The output of the power limit circuit 16 is fed into an override circuit 18 along with a command signal 20, which is a signal intended to run the centrifuge at a desired speed. The override circuit 18 overrides the speed command to shut off the transistor momentarily when power dissipation reaches and exceeds the set of values of the characteristic defined by the power limit circuit 16. The output of the override circuit 18 is filtered and amplified in a circuit 22 and used to control the base 24 of the transistor 50.

In operation, when the motor is accelerating (up to about 4200 rpm) a 1.5 ohm accelerating resistor 86 is switched by an FET 90 into the motor circuit in parallel with the portion 65 of the total resistance shunt 64 and 65, the elements of which are across the emitter-to-collector circuit of the transistor 50. FET 90 is under control of a microprocessor 92 responding to a motor speed signal. During acceleration, then, the entire shunt resistance is substantially reduced, e.g., to approximately 2.25 ohms from, e.g., 9 ohms. The transistor 50 is then turned on to quicken the acceleration of the motor 10. If the voltage and current sensed by the sensing circuits 12 and 14, and the logic (computation) of circuit 16 are such that the power limit characteristic is exceeded, the transistor is turned off momentarily and then allowed to turn back on, as the sensed current in transistor 50 then falls to zero.

High impedance operation of transistor 50 continues until the motor reaches a substantial fraction of its operating speed, at which point the back EMF of the motor would normally be such that overheating of the transistor 50 and stress on the power supply 78 would not be expected to occur. The microprocessor 92 then opens the circuit through FET 90, restoring the 9 ohms value of the shunt resistance. The transistor 50 then regulates the voltage supplied to the motor 10 to regulate motor speed to the desired speed value corresponding to the command signal 20. If, however, the power dissipation limit characteristic is exceeded, as explained above, the power limit circuit will turn off the transistor momentarily to protect the transistor. This could happen, for instance, if a motor bearing were to suddenly freeze.

Voltage across the transistor junction is sensed by comparing the voltage of the power supply 78 to the voltage at the juncture 96 between the transistor 50 and the motor 10. To determine the current through the transistor, the total current through the motor 10 is determined from the voltage across a resistor 100 connected between the motor 10 and ground 98. The current in the shunt resistive circuit is measured by sensing the voltage across a 1 ohm resistor 64 in the shunt circuit. The difference between these two currents is, of course, the current through the transistor 50.

Figure 3:
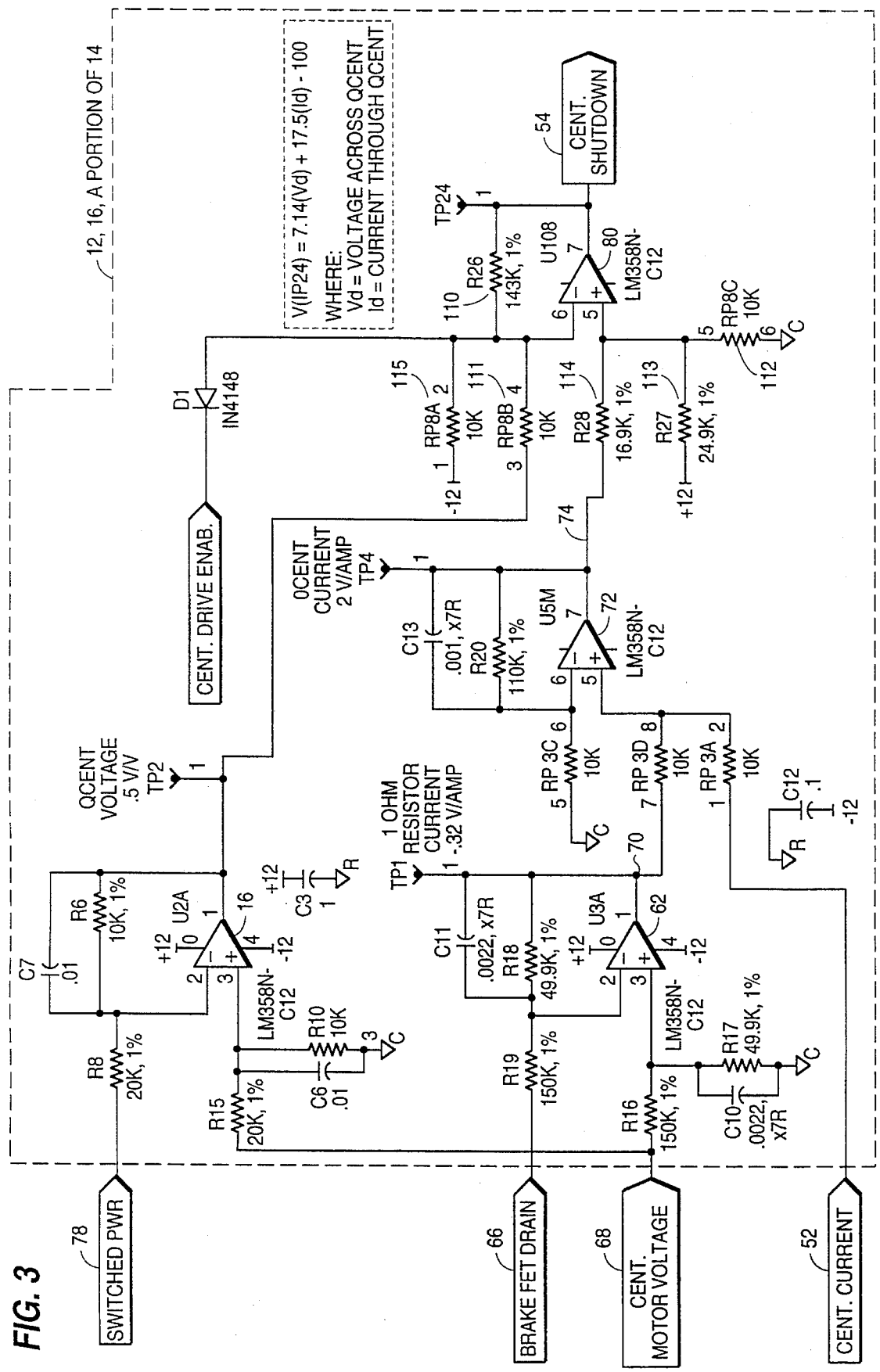
FIG. 3 shows details of certain preferred elements of an implementation of FIG. 1.
Figure 4A:
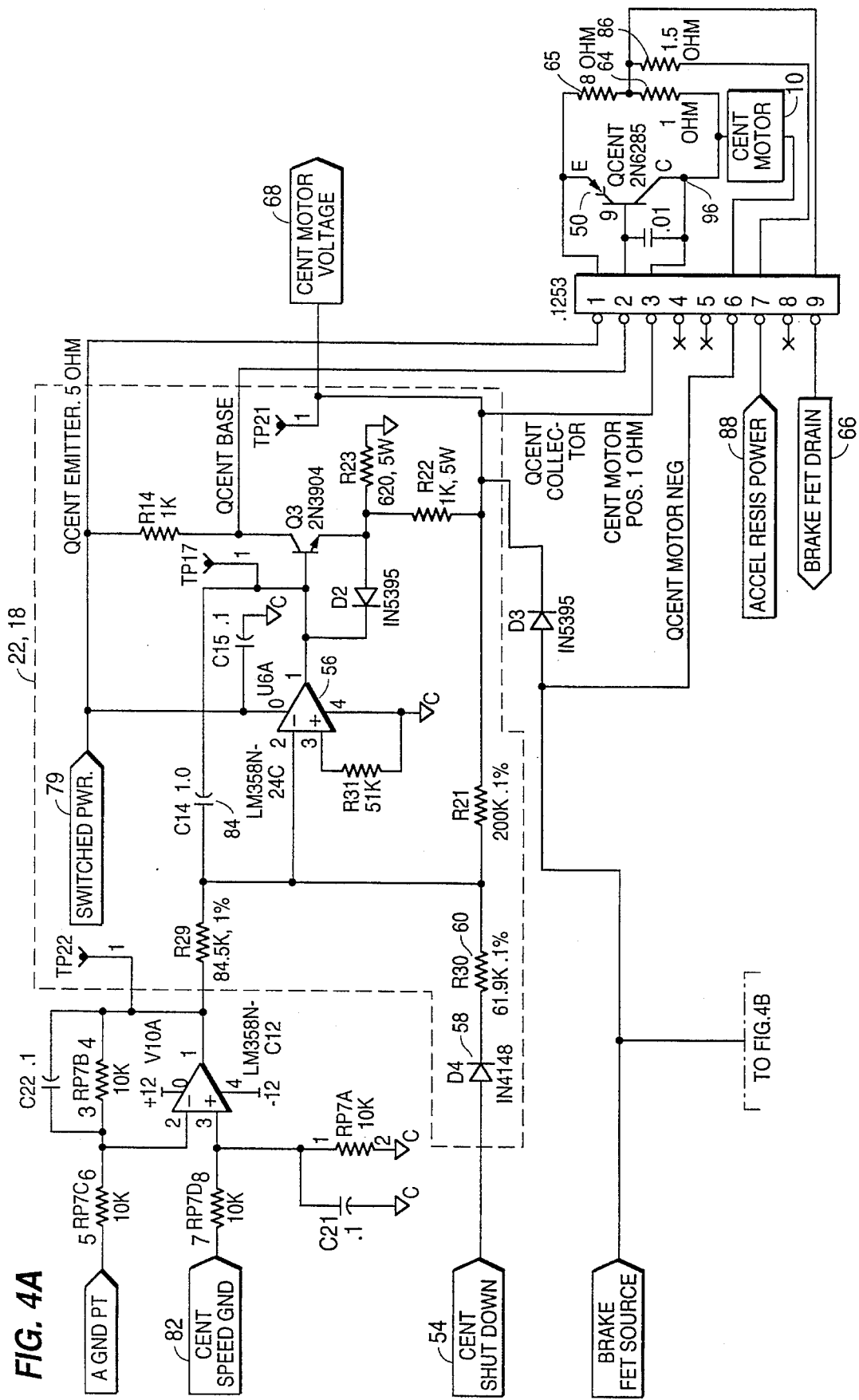
FIGS. 4A and 4B show other circuit details compatible with the implementation of FIG. 1.
Figure 4B:
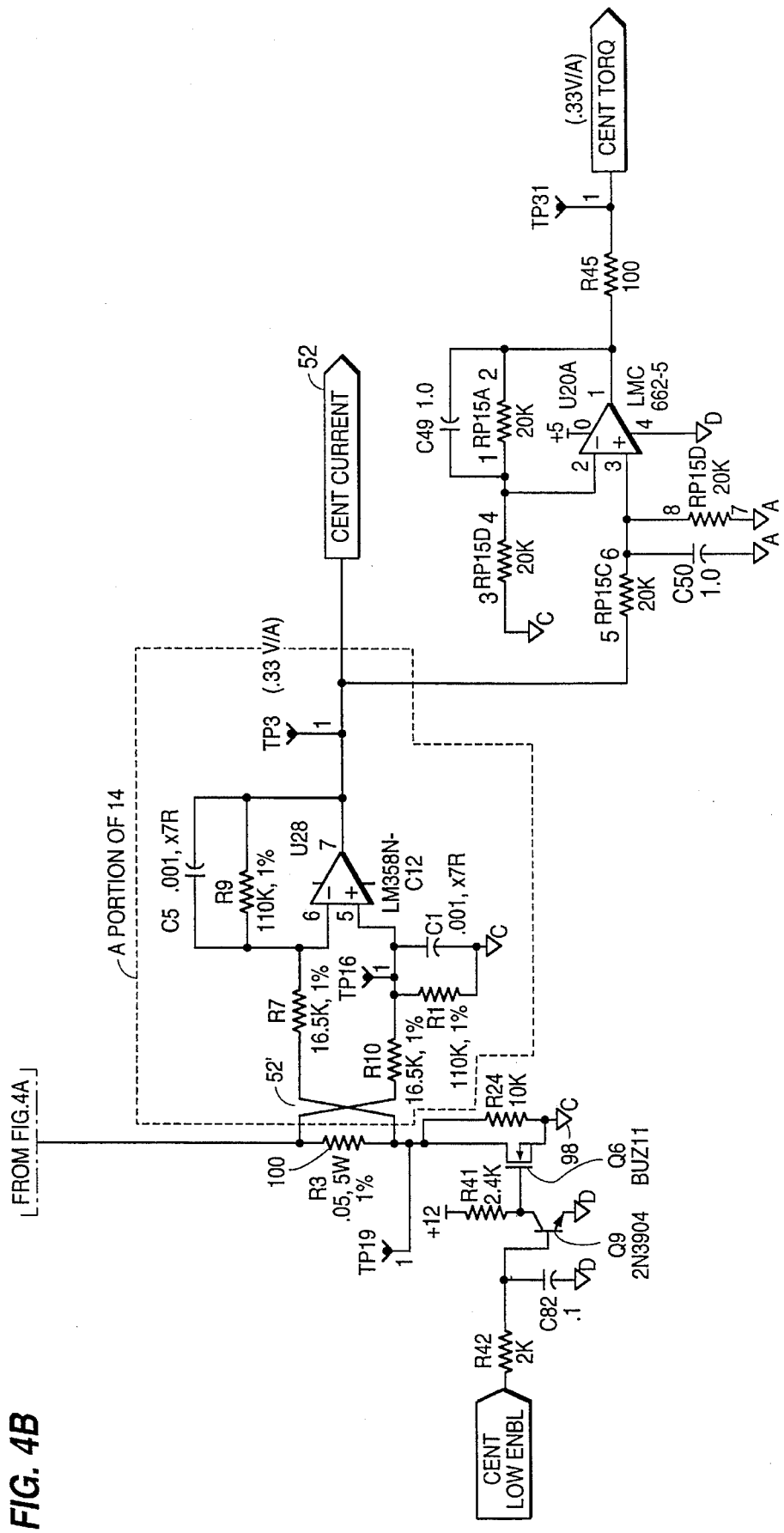

In the integrated circuit implementation of FIGS. 3, 4, and 5, the illustrated circuitry performs the function of limiting the maximum power that can be dissipated in the motor control transistor 50.

In FIG. 3, the illustrated circuitry corresponds to circuits 12 and 16 and a portion of circuit 14 of FIG. 1. The remainder of circuit 14, its first portion, is shown in FIG. 4A between points 52' and 52. Thus, point 52 is internal to circuit 14.

Further, in FIG. 3, the upper circuitry around amplifier 76 corresponds to circuit 12 of FIG. 1; and the circuitry around amplifier 80 corresponds to circuit 16 of FIG. 1. The latter sums the weighted or scaled values of V and I and the value C according to equation (1) and subjects the sums to the offset $D_L$ according to equation (2). Any positive difference is applied to connection 54 leading to override circuit 18 of FIG. 1. As an example, the offset is 0.6 volts and, when present, turns on diode 58 in FIG. 1 and quickly shuts off the drive to, and turns off, transistor 50. The resulting drop in sensed current restores non-limiting conditions; and transistor 50 is eventually turned on again because of the continuing presence of speed command signal 20. When the sum in equation 2 is negative, or below the voltage required to turn on diode 58, the power limiting function does not effect the speed control input from the microprocessor 92. The integrating filter formed by amplifier 56 and capacitor 84 in FIG. 4A smooths the fast current impulses fed into the summing junction from the line 54 such that the current in the transistor does not oscillate during the power limiting period.

FIG. 5B shows the output portion 92" of circuit 92 Of FIG. 1, which drives FET 90.

Figure 5A:
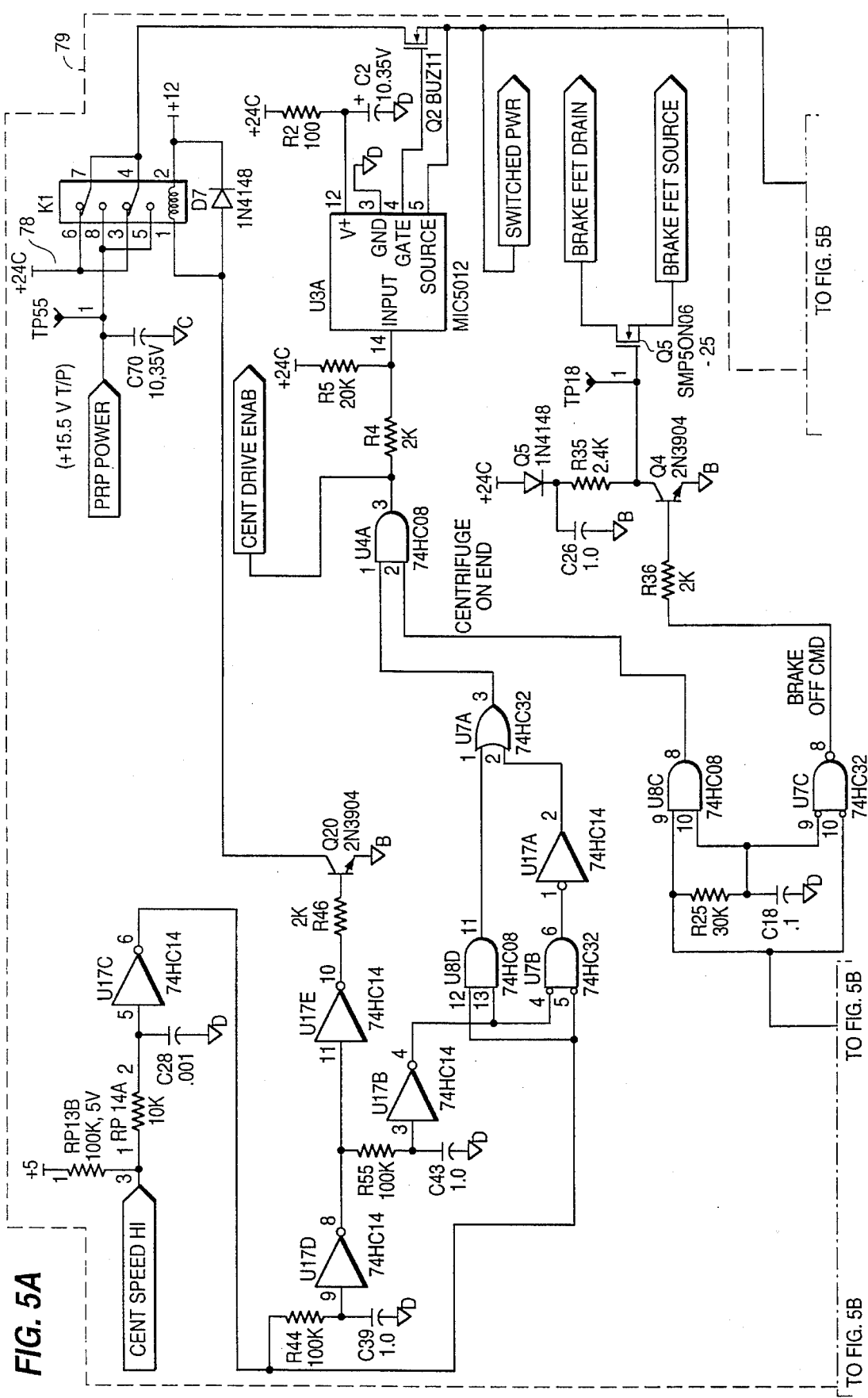

FIG. 5A shows one implementation of switch 79, shown in FIG. 1 between power supply 78 and transistor 50. Its structure and operation need not be described in detail.

The method of the invention includes supplying power to the variable speed drive motor 10 at least partly through the impedance of a controllable semiconductive device 50, establishing a power dissipation limit characteristic (21 as shown in FIG. 2) for the impedance of the controllable semiconductive device, wherein current flow therethrough decreases monotonically with increasing voltage across it and provides maximum power dissipation in the impedance of the controllable semiconductive device for respective intermediate values ($I_T$, $V_T$) of the current and the voltage (see FIG. 2). It also includes maintaining operation of the controllable semiconductive device at the power dissipation limit characteristic by supplying a feedback signal to the controllable semiconductive device, for example, via connection 54, diode 58, and override circuit 18 in FIG. 1.

The method for controlling power further comprises the step of determining a maximum permissible power dissipation (FIG. 2) for the impedance of the controllable semiconductive device, including the step of establishing a power dissipation limit characteristic including the step of calculating the constants A, B, and C for the relationship $$AV+BI-C=0$$

where A, B, and C are selected by choosing point of tangency, ($V_T$, $I_T$) and requiring a condition according to equation (1), i.e., that the left side terms actually equal 0, (diode 58 just off). Then adjust it up by 10% and require that the equation equal a positive value high enough to turn on diode 58 and override speed command voltage. Finally, adjust $V_T$ up by 10%, with I=$I_T$, and require that the equation equal same positive value as before. Then solve 3 equations with 3 unknowns to find A, B and C. For an example, a point of tangency is chosen at $V_T$=7 V, $I_T$=20/7=2.85 A. The value used for the second and third equations is chosen as 5. Then solving gives A=7.14, B=17.5, C=−100. To solve for the required resistor values in FIG. 3, the following equations must be solved simultaneously $$A = (.5) \left[ \frac{R(110)}{R(111)} \right]$$

$$B = (2) \left[ \frac{R(112)11R(113)}{(R(112)11R(113)) + R(114)} \right] \left[ 1 + \frac{R(110)}{R(115)11R(111)} \right]$$

$$C = \left[ (-12) \left\{ \frac{R(110)}{R(115)} \right\} \right] + (12)$$

$$\left[ \frac{R(112)11R(114)}{(R(112)11R(114)) + R(113)} \right] \left[ 1 + \frac{R(110)}{R(115)11R(111)} \right]$$

The fixed gains of 0.5 in the equation for A and 2 in the equation for B came from the gains in FIG. 3 from operational amplifiers 16 and 72, respectively.

The particular application of the power unit was a good fit for the ABS system, which typically spends a small percentage of its motor's running time in the higher power dissipation, acceleration period. In a typical ABS system cycle, the motor accelerates for about 20 seconds, runs at a fixed speed for 3 to 6 minutes, and then is off for 1 minute. This cycle can be repeated up to 10 times in extreme blood loss conditions. The small percentage of time spent in the higher power dissipation, acceleration period, gives the transistor junction, which is being protected, time to cool before the next high power period.

It will be apparent to those skilled in the art that various modifications and variations can be made in the arrangement of the present invention and in the associated method without departing from the scope or spirit of the invention. As an example, nonlinear power dissipation limit characteristics can readily be supplied and, indeed, need not be calculated at all. It will, however, remain desirable for any such characteristic to have a generally decreasing trend, so that initial starting current is high compared to later controlled values. It is also apparent that inherently digital circuit techniques can be used, and can, for example, replace the filter portion of circuit 22. On the other hand, it is not necessary to turn transistor 50 off to maintain control of its heating according to the invention.

It should also be apparent that the principles of method can be extended. For example, a curvilinear, but not strictly monotonically decreasing, characteristic can be devised.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductive power unit for a variable speed drive motor, comprising a controllable semiconductive device connected to provide a variable impedance path between a power supply and the variable speed drive motor;

means connected in parallel with the variable impedance path for providing a minimum current to the variable speed motor;

means for assisting starting acceleration of the variable speed motor including a controllable impedance shunt connected in parallel with at least a portion of the minimum current providing means; and means for establishing a power dissipation limit characteristic for the variable impedance path, wherein current flow through the variable impedance path decreases with increasing voltage variable across the impedance path, and for providing maximum power dissipation in the variable impedance path for respective intermediate values of the current and the voltage, said maximum power dissipation being a safe value for the controllable semiconductive device, wherein the means for establishing the power dissipation limit characteristic for the variable impedance path includes;

means for applying a speed command signal to the controllable semiconductive device to change the impedance of the variable impedance path, whereby to change the speed of the variable speed motor; and means for overriding the speed command signal when the power dissipation in the variable impedance path exceeds a value corresponding to a point on the power dissipation limit characteristic, as determined for the existing voltage across the variable impedance path, and temporarily stopping current flow in the variable impedance path.

2. The semiconductive power unit for a variable speed drive motor according to claim 1, wherein the means for overriding the speed command signal includes means for determining deviation from the power dissipation limit characteristic and for stopping current flow in the variable impedance path when the determined deviation exceeds a limit value in the sense of increased power dissipation in the controllable semiconductor device.

3. The semiconductive power unit for a variable speed drive motor according to claim 2, further including means for controlling the controllable impedance shunt to terminate assistance of starting acceleration of the variable speed motor when the variable speed motor reaches a substantial fraction of its operating speed.

4. The semiconductive power unit for a variable speed drive motor according to claim 1, further including means for controlling the controllable impedance shunt to terminate assistance of starting acceleration of the variable speed motor when the variable speed motor reaches a substantial fraction of its operating speed.

5. The semiconductive power unit for a variable speed drive motor according to claim 4, further comprising means for determining a maximum permissible power dissipation for the impedance of the controllable semiconductive device, the means for overriding the speed command signal including means for calculating the constants A, B, and C for the relationship $$AV+BI-C=0$$

where the relationship represents a line segment starting from the value of V across the controllable semiconductive device for which I in the impedance thereof is zero and proceeding to a tangent point with a curve of a constant product of V and I, where the constant product is the maximum permissible power dissipation and becomes the value corresponding to a pertinent point on the power dissipation limit characteristic.

6. The semiconductive power unit for a variable speed drive motor according to claim 5, further comprising means for stopping current flow in the impedance when $AV+BI-C \geq DEV._{LIMIT}$, wherein $DEV._{LIMIT}$ is a selected deviation limit, and means for subsequently turning the current flow back on.

7. The semiconductive power unit for a variable speed drive motor according to claim 1, further comprising means for determining a maximum permissible power dissipation for the impedance of the controllable semiconductive device, the means for overriding the speed command signal including means for calculating the constants A, B, and C for the relationship $$AV+BI-C=0$$

where the relationship represents a line segment starting from the value of V across the controllable semiconductive device for which I in the impedance thereof is zero and proceeding to a tangent point with a curve of a constant product of V and I, where the constant product is the maximum permissible power dissipation and becomes the value corresponding to a pertinent point on the power dissipation limit characteristic.

8. The semiconductive power unit for a variable speed drive motor according to claim 7, further comprising means for stopping current flow in the impedance when $AV+BI-C \geq DEV._{LIMIT}$, wherein $DEV._{LIMIT}$ is a selected deviation limit, and means for subsequently turning the current flow back on.

9. A semiconductive power unit for a variable speed drive motor, comprising means for supplying electrical power from a power supply to the variable speed drive motor, including a controllable semiconductive device connected to provide a variable impedance branch path between the power supply and the variable speed drive motor; and means for establishing a power dissipation characteristic for the variable impedance branch path, wherein current flow therethrough decreases generally with increasing voltage across the variable impedance branch and provides maximum power dissipation in the variable impedance branch path for respective intermediate values of current and voltage, said maximum power dissipation being a safe value for the controllable semiconductive device, the establishing means including means for providing a feedback signal to the controllable semiconductive device to maintain its operation at the power dissipation limit characteristic, wherein the means for establishing a power dissipation limit characteristic for the variable impedance branch path includes:

means for applying a speed command signal to the controllable semiconductive device to change the impedance of the variable impedance branch path to change the speed of the variable speed motor; and means for overriding the speed command signal when the power dissipation in the variable impedance branch path exceeds a value corresponding to a point on the power dissipation limit characteristic, as determined for the existing voltage across the variable impedance branch path and temporarily stopping current flow in the variable impedance branch path.

10. The semiconductive power unit for a variable speed drive motor according to claim 9, wherein the means for overriding the speed command signal includes means for determining deviation above the power dissipation limit characteristic and for further impeding current flow in the variable impedance branch path when the determined deviation exceeds a limit value in the sense of increased power dissipation in the controllable semiconductor device.

11. The semiconductor power unit for a variable speed drive motor according to claim 10, further including means for assisting starting acceleration of the variable speed motor and for terminating assistance of starting acceleration of the variable speed motor when the variable speed motor reaches a substantial fraction of its operating speed.

12. The semiconductive power unit for a variable speed drive motor according to claim 9, further including means for controlling a controllable impedance shunt for the semiconductive device to assist starting acceleration of the variable speed motor and to terminate assistance of starting acceleration of the variable speed motor when the variable speed motor reaches a substantial fraction of its operating speed.

13. The semiconductive power unit for a variable speed drive motor according to claim 12, further comprising means for determining a maximum permissible power dissipation for the impedance of the controllable semiconductive device, the means for overriding the speed command signal including means for calculating the constants A, B, and C for the relationship $$AV+BI-C=0$$

where the relationship represents a line segment starting from the value of V across the controllable semiconductive device for which I in the impedance thereof is zero and proceeding to a tangent point with a curve of a constant product of V and I, where the constant product is the maximum permissible power dissipation and becomes the value corresponding to a pertinent point on the power dissipation limit characteristic; and means for stopping current flow in the impedance when $AV+BI-C \geq DEV._{LIMIT}$, wherein $DEV._{LIMIT}$ is a selected deviation limit, and means for subsequently turning the current flow back on.

14. The semiconductive power unit for a variable speed drive motor according to claim 9, further comprising means for determining a maximum permissible power dissipation for the impedance of the controllable semiconductive device, the means for overriding the speed command signal including means for calculating the constants A, B, and C for the relationship $$AV+BI-C=0$$

where the relationship represents a line segment starting from the value of V across the controllable semiconductive device for which I in the impedance thereof is zero and proceeding to a tangent point with a curve of a constant product of V and I, where the constant product is the maximum permissible power dissipation and becomes the value corresponding to a pertinent point on the power dissipation limit characteristic.

15. The semiconductive power unit for a variable speed drive motor according to claim 14, further comprising means for stopping current flow in the impedance when $AV+BI-C \geq DEV._{LIMIT}$, wherein $DEV._{LIMIT}$ is a selected deviation limit, and means for subsequently turning the current flow back on.

16. A method for controlling power supplied to a variable speed drive motor by varying the impedance of a controllable semiconductive device and concurrently limiting power dissipation in the controllable semiconductive device, comprising the steps of:

supplying power to the variable speed drive motor at least partly through the impedance of the controllable semiconductive device;

establishing a power dissipation limit characteristic for the impedance of the controllable semiconductive device, wherein current flow therethrough decreases monotonically with increasing voltage across the impedance and provides maximum power dissipation in the impedance of the controllable semiconductive device for respective intermediate values of the current and the voltage, including maintaining operation of the controllable semiconductive device at the power dissipation limit characteristic by supplying a feedback signal to the controllable semiconductive device, wherein the step of establishing a power dissipation limit characteristic includes the step of applying a speed command signal to the controllable semiconductive device to change the impedance to change the speed of the variable speed motor; and the step of overriding the speed command signal when the power dissipation exceeds a value corresponding to a pertinent point on the power dissipation limit characteristic and temporarily stopping the flow of current in the impedance of the controllable semiconductive device to tend to return operation to the power dissipation limit characteristic.

17. The method for controlling power according to claim 16, wherein the step of overriding the speed command signal includes the step of determining a positive deviation from the power dissipation limit characteristic and stopping current flow through the impedance when the positive deviation exceeds a limit value.

18. The method for controlling power according to claim 17, further including the step of assisting starting acceleration of the variable speed motor and the step of terminating the assisting of the starting acceleration when the variable speed motor reaches a substantial fraction of its operating speed.

19. The method for controlling power according to claim 16, further comprising the step of determining a maximum permissible power dissipation for the impedance of the controllable semiconductive device, the step of overriding the speed command signal including the step of calculating the constants A, B, and C for the relationship $$AV+BI-C=0$$

where the relationship represents a line segment starting from the value of V across the controllable semiconductive device for which I in the impedance thereof is zero and proceeding to a tangent point with a curve of a constant product of V and I, where the constant product is the maximum permissible power dissipation and becomes the value corresponding to a pertinent point on the power dissipation limit characteristic.

20. The method for controlling power according to claim 19, wherein the step of maintaining operation of the controllable semiconductive device at the power dissipation limit characteristic includes temporarily stopping current flow in the impedance when $AV+BI-C \geqq DEV._{LIMIT}$, wherein $DEV._{LIMIT}$ is a selected deviation limit.

* * * * *